US00RE44618E

(19) United States
(12) Reissued Patent
Kyung

(10) Patent Number: US RE44,618 E
(45) Date of Reissued Patent: Dec. 3, 2013

(54) DEVICES AND METHODS FOR CONTROLLING ACTIVE TERMINATION RESISTORS IN A MEMORY SYSTEM

(75) Inventor: Kye-Hyun Kyung, Yongin (KR)

(73) Assignee: Samsung Electronics Co., Ltd., Suwon-Si (KR)

(21) Appl. No.: 13/403,738

(22) Filed: Feb. 23, 2012

Related U.S. Patent Documents

Reissue of:
(64) Patent No.: 7,787,283
Issued: Aug. 31, 2010
Appl. No.: 12/567,817
Filed: Sep. 28, 2009

U.S. Applications:
(63) Continuation of application No. 11/708,046, filed on Feb. 20, 2007, now Pat. No. 7,616,473, which is a continuation of application No. 10/377,604, filed on Mar. 4, 2003, now abandoned.

(30) Foreign Application Priority Data

Aug. 17, 2002 (KR) ..... 02-48708

(51) Int. Cl.
*G11C 11/00* (2006.01)
*G11C 13/00* (2006.01)

(52) U.S. Cl.
CPC ..... *G11C 13/0069* (2013.01)
USPC ..... 365/148; 365/189.09; 365/189.11; 365/233.12; 365/233.11; 365/194

(58) Field of Classification Search
CPC .... G11C 11/4076; G11C 7/1072; G11C 7/22; G11C 7/222; G11C 8/18; G11C 13/0069
USPC ..... 365/148, 189.09, 189.11, 233.12, 365/233.11, 194
See application file for complete search history.

(56) References Cited

U.S. PATENT DOCUMENTS

| | | | | |
|---|---|---|---|---|
| 3,748,492 | A | 7/1973 | Baker | |
| 4,425,632 | A | 1/1984 | Iwahashi et al. | |
| 4,748,426 | A | 5/1988 | Stewart | |
| 5,502,682 | A | 3/1996 | Yoshimura | |
| 5,831,467 | A | 11/1998 | Leung et al. | |
| 5,867,446 | A | 2/1999 | Konishi et al. | |
| 6,331,787 | B1 | 12/2001 | Whitworth et al. | |
| 6,356,106 | B1 | 3/2002 | Greeff et al. | |
| 6,480,026 | B2 | 11/2002 | Andrews et al. | |
| 6,567,297 | B2 | 5/2003 | Baker | |
| 6,762,620 | B2 | 7/2004 | Jang et al. | |
| 6,806,728 | B2 | 10/2004 | Nguyen et al. | |
| 6,836,142 | B2 | 12/2004 | Lesea et al. | |
| 6,983,923 | B2 | 1/2006 | Fukui et al. | |
| 2002/0080883 | A1 * | 6/2002 | Tamura et al. | 375/257 |
| 2003/0007379 | A1 | 1/2003 | Osaka et al. | |
| 2003/0080891 | A1 | 5/2003 | Nagano | |
| 2003/0086501 | A1 | 5/2003 | Dreps et al. | |

(Continued)

*Primary Examiner* — Thong Q Le
(74) *Attorney, Agent, or Firm* — Sughrue Mion, PLLC

(57) ABSTRACT

A termination resistor is mounted on a memory circuit and provides a termination resistance for the memory circuit. The termination resistor includes a node, a plurality of first termination resistors responsive to a corresponding control signal and connected between a power voltage and the node, and a plurality of second termination resistors responsive to a corresponding control signal and connected between a ground voltage and the node.

63 Claims, 22 Drawing Sheets

(56) References Cited

U.S. PATENT DOCUMENTS

2003/0099138 A1 5/2003 Kyung
2003/0189441 A1 10/2003 Nguyen et al.
2003/0218477 A1 11/2003 Jang et al.

* cited by examiner

| DLL OR PLL STATUS | | CONTROL MODE OF ACTIVE TERMINATOR | |
|---|---|---|---|
| DiMM0 | DiMM1 | DiMM0 | DiMM1 |
| active | active | Sync cntr | Sync cntr |
| active | Pdn/stby | Off | Async cntr |
| Pdn/stby | active | Async cntr | Off |
| Pdn/stby | Pdn/stby | Off | Off |

| DLL OR PLL STATUS | | CONTROL MODE OF ACTIVE TERMINATOR | |
|---|---|---|---|
| DIMM0 | DIMM1 | DIMM0 | DIMM1 |
| active | – | Sync cntr | – |
| Pdn/stby | – | Off | – |
| – | active | – | Sync cntr |
| – | Pdn/stby | – | Off |

FIG. 12A

| DLL OR PLL STATUS | | | | CONTROL MODE OF ACTIVE TERMINATOR | | | |
|---|---|---|---|---|---|---|---|
| R0 | R1 | R2 | R3 | R0 | R1 | R2 | R3 |
| active | active | active | active | Sync cntr | | Sync cntr | |
| active | active | active | Pdn/stby | Sync cntr | | Sync cntr | Off (flag) |
| active | active | Pdn/stby | active | Sync cntr | | Off (flag) | Sync cntr |
| active | active | Pdn/stby | Pdn/stby | Off (ATC or flag) | | Async cntr | |
| active | Pdn/stby | active | active | Sync cntr | Off (flag) | Sync cntr | |
| active | Pdn/stby | active | Pdn/stby | Sync cntr | Off (flag) | Sync cntr | Off (flag) |
| active | Pdn/stby | Pdn/stby | active | Sync cntr | Off (flag) | Off (flag) | Sync cntr |
| active | Pdn/stby | Pdn/stby | Pdn/stby | Off (ATC or flag) | | Async cntr | |
| Pdn/stby | active | active | active | Off (flag) | Sync cntr | Sync cntr | |
| Pdn/stby | active | active | Pdn/stby | Off (flag) | Sync cntr | Sync cntr | Off (flag) |
| Pdn/stby | active | Pdn/stby | active | Off (flag) | Sync cntr | Off (flag) | Sync cntr |
| Pdn/stby | active | Pdn/stby | Pdn/stby | Off (ATC or flag) | | Async cntr | |
| Pdn/stby | Pdn/stby | active | active | Async cntr | | Off (ATC or flag) | |
| Pdn/stby | Pdn/stby | active | Pdn/stby | Async cntr | | Off (ATC or flag) | |
| Pdn/stby | Pdn/stby | Pdn/stby | active | Async cntr | | Off (ATC or flag) | |
| Pdn/stby | Pdn/stby | Pdn/stby | Pdn/stby | Off (ATC or flag) | | Off (ATC or flag) | |

FIG. 12B

| DLL OR PLL STATUS | | | CONTROL MODE OF ACTIVE TERMINATOR | | |
|---|---|---|---|---|---|
| R0 | R1 | R2 | R0 | R1 | R2 |
| active | active | active | Sync cntr | | Sync cntr |
| active | active | Pdn/stby | Off (ATC or flag) | | Async cntr |
| active | Pdn/stby | active | Sync cntr | Off (flag) | Sync cntr |
| active | Pdn/stby | Pdn/stby | Off (ATC or flag) | | Async cntr |
| Pdn/stby | active | active | Off (flag) | Sync cntr | Sync cntr |
| Pdn/stby | active | Pdn/stby | Off (ATC or flag) | | Async cntr |
| Pdn/stby | Pdn/stby | active | Async cntr | | Off (ATC or flag) |
| Pdn/stby | Pdn/stby | Pdn/stby | Off (ATC or flag) | | Off (ATC or flag) |

FIG. 12C

| DLL OR PLL STATUS | | CONTROL MODE OF ACTIVE TERMINATOR | |
|---|---|---|---|
| R0 | R1 | R0 | R1 |
| active | active | Sync cntr | Sync cntr |
| active | Pdn/stby | Off | Async cntr |
| Pdn/stby | active | Async cntr | Off |
| Pdn/stby | Pdn/stby | Off | Off |

FIG. 12D

| DLL OR PLL STATUS | | CONTROL MODE OF ACTIVE TERMINATOR | |
|---|---|---|---|
| R0 | R1 | R0 | R1 |
| active | active | Sync cntr | |
| active | Pdn/stby | Sync cntr | Off |
| Pdn/stby | active | Off | Sync cntr |
| Pdn/stby | Pdn/stby | Off | Off |

FIG. 12E

| DLL OR PLL STATUS | | | | CONTROL MODE OF ACTIVE TERMINATOR | | | |
|---|---|---|---|---|---|---|---|
| R0 | R1 | R2 | R3 | R0 | R1 | R2 | R3 |
| active | active | active | active | Sync cntr | | Sync cntr | |
| active | active | active | Pdn/stby | Sync cntr | | Sync cntr | Off |
| active | active | Pdn/stby | active | Sync cntr | | Off | Sync cntr |
| active | active | Pdn/stby | Pdn/stby | Off | | Async cntr | |
| active | Pdn/stby | active | active | Sync cntr | Off | Sync cntr | |
| active | Pdn/stby | active | Pdn/stby | Sync cntr | Off | Sync cntr | Off |
| active | Pdn/stby | Pdn/stby | active | Sync cntr | Off | Off | Sync cntr |
| active | Pdn/stby | Pdn/stby | Pdn/stby | Off | | Async cntr | |
| Pdn/stby | active | active | active | Off | Sync cntr | Sync cntr | |
| Pdn/stby | active | active | Pdn/stby | Off | Sync cntr | Sync cntr | Off |
| Pdn/stby | active | Pdn/stby | active | Off | Sync cntr | Off | Sync cntr |
| Pdn/stby | active | Pdn/stby | Pdn/stby | Off | | Async cntr | |
| Pdn/stby | Pdn/stby | active | active | Async cntr | | Off | |
| Pdn/stby | Pdn/stby | active | Pdn/stby | Async cntr | | Off | |
| Pdn/stby | Pdn/stby | Pdn/stby | active | Async cntr | | Off | |
| Pdn/stby | Pdn/stby | Pdn/stby | Pdn/stby | Off | | Off | |

DEVICES AND METHODS FOR CONTROLLING ACTIVE TERMINATION RESISTORS IN A MEMORY SYSTEM

Matter enclosed in heavy brackets [ ] appears in the original patent but forms no part of this reissue specification; matter printed in italics indicates the additions made by reissue.

CROSS-REFERENCE TO RELATED APPLICATION(S)

This is a continuation of U.S. non-provisional patent application Ser. No. 11/708,046, filed Feb. 20, 2007 now, U.S. Pat. No. 7,616,473, which is a continuation of U.S. non-provisional patent application Ser. No. 10/377,604, filed Mar. 4, 2003 now abandoned. The disclosures of both U.S. non-provisional applications are incorporated herein by reference in their entirety.

BACKGROUND OF THE INVENTION

1. Field of the Invention

The present invention generally relates to memory circuits and systems, and more particularly, the present invention relates to devices and methods for controlling active termination resistors which are used to improve signaling characteristics in memory circuits and systems.

2. Description of the Related Art

Generally, as the bus frequency of a memory system (e.g., a memory system employing DRAM devices) increases, the signal integrity within the memory system degrades. Thus, a variety of bus topologies capable of reducing signal distortion have been developed. For example, it is known that the use of resistive terminations at either the receiver and/or transmitter sides within the memory system is an effective means for absorbing reflections and thereby improving signal performance. Resistive termination configurations of this type generally fall into one of two categories, i.e., passive termination or active termination.

FIG. 1 shows an example of a passive resistive termination in a memory system. In particular, a so-called stub series terminated logic (SSTL) standard is illustrated in which the bus of a memory system 100 is connected to termination voltages Vterm through termination resistors Rterm, and DRAM-mounted memory modules are inserted into slots having predetermined stub resistors Rstub. In this case, the stub resistors Rstub are not mounted on the DRAM chips, and accordingly, the example here is one of an "off-chip" passive resistive termination.

When used in a double data rate (DDR) memory system, the passive resistive termination of the SSTL standard is capable of ensuring a data rate of about 300 Mbps. However, any increase in data rate beyond 300 Mbps tends to degrade signal integrity by increasing the load of the bus having the resistive stubs. In fact, a data rate of 400 Mbps or greater is generally not achievable with the SSTL bus configuration.

FIG. 2 shows an example of a memory system having an active resistive termination, and in particular, an active-termination stub bus configuration. Here, each chipset for controlling the operation of the memory modules, and DRAMs mounted on the respective modules, includes an active termination resistor Rterm. The active termination resistor Rterm is mounted "on-chip" and may be implemented by complementary metal oxide semiconductor (CMOS) devices. In this memory system, active bus termination is achieved through input/output (I/O) ports mounted on the modules.

Each combination of one or more resistive elements Rterm and one or more ON/OFF switching devices in each DRAM is generally referred to herein as an "active terminator". Active terminators can take on any number of different configurations. FIG. 3 illustrates an example of an active terminator having a center-tapped termination which is described in U.S. Pat. No. 4,748,426. In this example, the effective active termination resistance Rterm of the circuit can be varied between different values (e.g., 150 ohms and 75 ohms) depending on the enable/disable state of signals ON/OFF_1 and ON/OFF_2.

When a DRAM mounted in a memory module is not accessed (e.g., not read or written), the active termination resistor Rterm thereof is enabled by connecting the same to the bus to improve signal integrity. In contrast, when a DRAM is accessed (e.g., read or written), the active termination resistor Rterm thereof is disabled and disconnected from the bus to reduce load.

However, a considerable amount of time is required to enable the active termination resistors installed in the DRAM circuits in response to the active termination control signals, and when a module-interleaved write/read operation is performed, this time lapse can result in data bubbles, thereby degrading memory system performance.

DRAMs which include a delay locked loop (DLL) or phase locked loop (PLL) can overcome this problem by controlling the enabling/disabling of the active termination resistor thereof in synchronization with an external clock. However, in the case where the DLL or PLL is deactivated during a power down or standby mode of DRAMs of a corresponding memory module, enabling/disabling of the active termination resistor cannot be controlled.

SUMMARY OF THE INVENTION

According to one aspect of the present invention, there is provided a termination resistor which is mounted on a memory circuit so as to provide a termination resistance for the memory circuit, and which includes a node, a plurality of first termination resistors responsive to a first control signal and connected between a first reference voltage and the node, and a plurality of second termination resistors responsive to a second control signal and connected between a second reference voltage and the node.

In the termination resistor, a resistance between the node and the first reference voltage is tuned by the plurality of first termination resistors connected between the node and the first reference voltage in response to the first control signal. A resistance between the node and the second reference voltage is tuned by the plurality of second termination resistors connected between the node and the second reference voltage in response to the second control signal.

According to another aspect of the present invention, there is provided a termination resistor which is mounted on a memory circuit so as to provide a termination resistance for the memory circuit, and which includes a node, a first UP resistor connected between a first reference voltage and the node, a second UP resistor responsive to a first control signal and connected between the first reference voltage and the node, and a third UP resistor responsive to a second control signal and connected between the first reference voltage and the node.

According to still another aspect of the present invention, the termination resistor further includes a first DOWN resistor connected between a second reference voltage and the node, a second DOWN resistor responsive to a third control signal and connected between the second reference voltage and the node, and a third DOWN resistor responsive to a fourth control signal and connected between the second reference voltage and the node.

According to still another aspect of the present invention, the termination resistor further includes a first switching circuit which electrically couples the first reference voltage to the first UP resistor in response to an UP signal, a second switching circuit which electrically couples the first reference voltage to the second UP resistor in response to the first control signal, and a third switching circuit which electrically couples the first reference voltage to the third UP resistor in response to the second control signal. The terminator resistor may further include a fourth switching circuit which electrically couples the first DOWN resistor to the second reference voltage in response to a DOWN signal, a fifth switching circuit which electrically couples the second DOWN resistor to the second reference voltage in response to the third control signal, and a sixth switching circuit which electrically couples the third DOWN resistor to the second reference voltage in response to the fourth control signal.

According to another aspect of the present invention, there is provided a method for tuning a resistance of a terminal resistor mounted on a memory circuit so as to provide a termination resistance for the memory circuit, the method including measuring, in response to a first control signal, a resistance of at least one of a plurality of first termination resistors which are connected between a first reference voltage and a node, and adjusting, in response to a second control signal and according to the measured resistance of the at least one of the plurality of first termination resistors, the number of first termination resistors electrically coupled between the first reference voltage and the node. The method may further include measuring, in response to a third control signal, a resistance of at least one of a plurality of second termination resistors which are connected between a second reference voltage and the node, and adjusting, in response to a fourth control signal and according to the measured resistance of the at least one of the plurality of second termination resistors, the number of second termination resistors electrically coupled between the second reference voltage and the node.

BRIEF DESCRIPTION OF THE DRAWINGS

The above object and advantages of the present invention will become readily apparent from the detailed description that follows, with reference to the accompanying drawings, in which:

FIGS. 12A through 12E are tables of the status of each DiMM and control modes of active terminators according to the present invention;

DETAILED DESCRIPTION OF THE PREFERRED EMBODIMENTS

The following description of preferred illustrative embodiments and the accompanying drawings are provided for a thorough and complete understanding of the advantages and features of the present invention, and to fully convey characteristics of the invention to those skilled in the art. However, the description is not intended to limit the scope of the invention beyond that which is defined by the appended claims.

Figure 1:
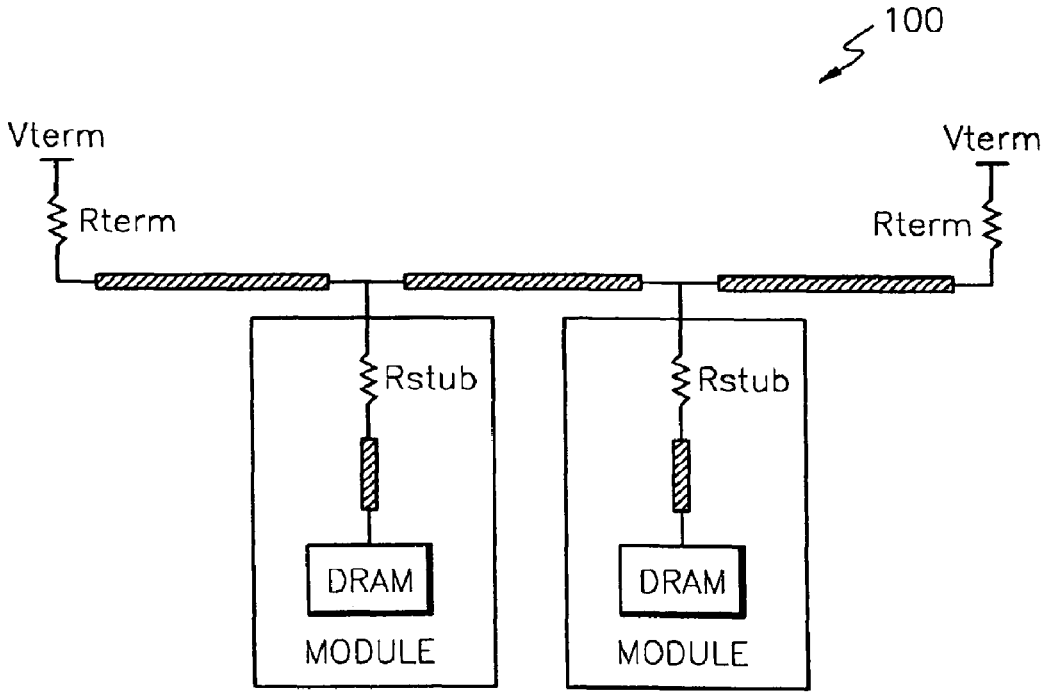
FIG. 1 (PRIOR ART)
FIG. 1 shows a memory system having a conventional stub series terminated logic (SSTL) configuration.
Figure 2:
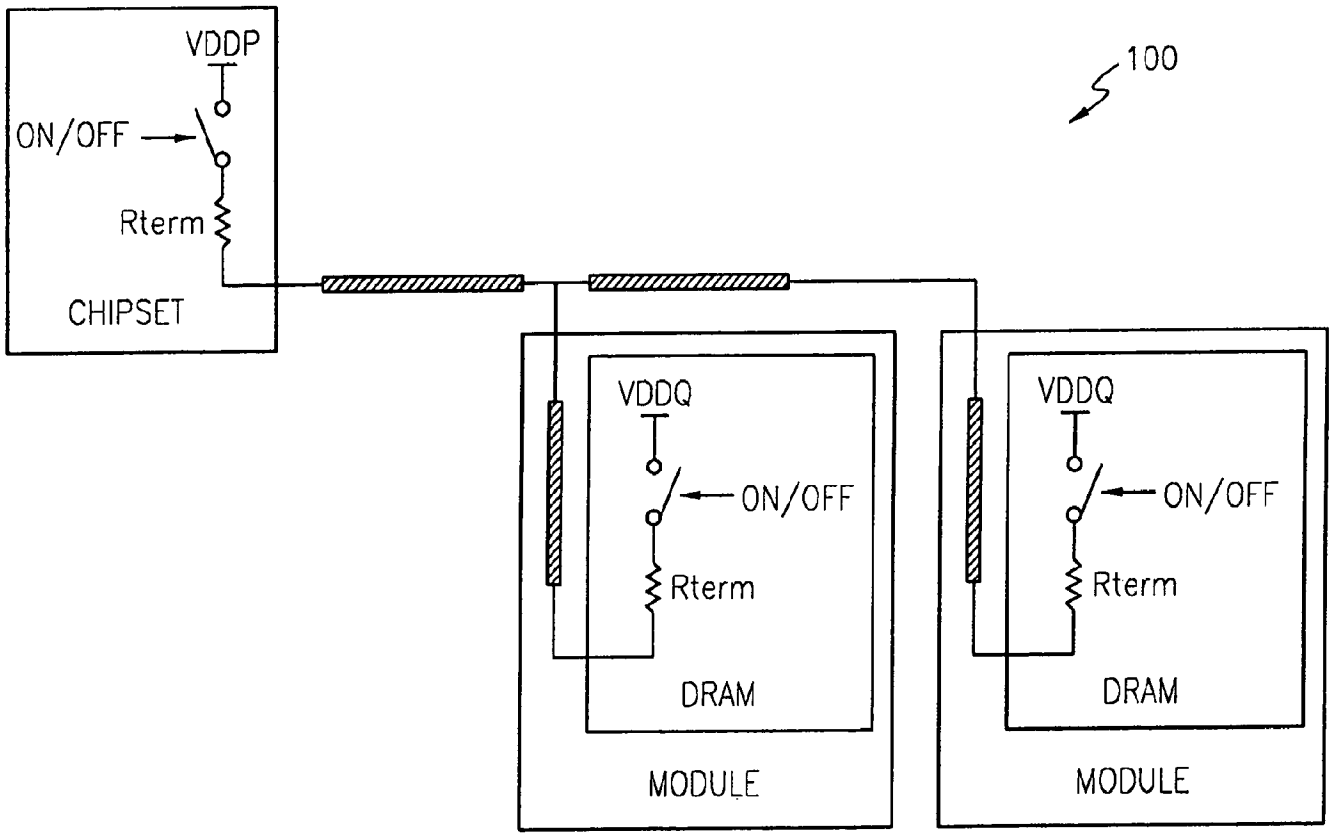
FIG. 2 (PRIOR ART)
FIG. 2 shows a memory system having a conventional active-termination stub bus configuration.
Figure 3:
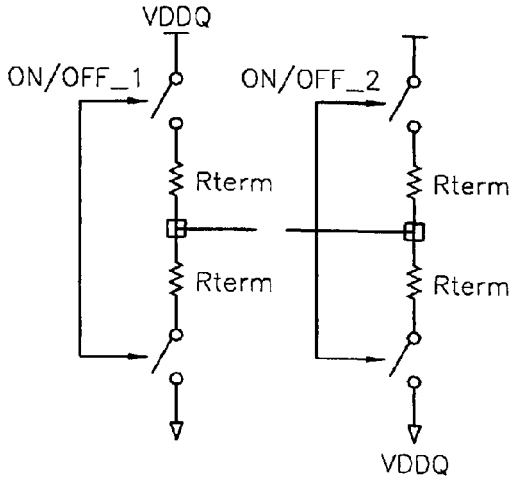
FIG. 3 illustrates an example of a conventional active terminator having a center-tapped termination.
Figure 4:
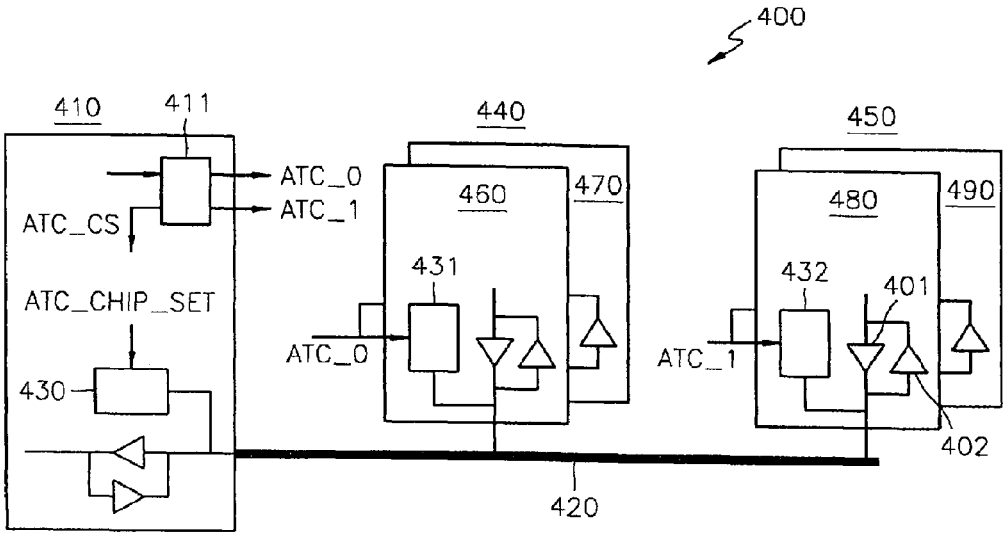
FIG. 4 shows a memory system according to an embodiment of the present invention having an active-termination stub bus configuration.

FIG. 4 shows a preferred embodiment of a memory system 400 according to an embodiment of the present invention in which an active-termination stub bus configuration is employed. Referring to FIG. 4, the memory system 400 includes a chipset 410, a data bus 420, a first memory module 440 in which DRAMs 460 and 470 are mounted, and a second memory module 450 in which DRAMs 480 and 490 are mounted. The memory modules 440 and 450 may be mounted in card slots (not shown) of the memory system 400.

The first and second memory modules 440 and 450 may be implemented, for example, by a dual in-line memory module (DIMM) or single in-line memory module (SIMM). Further, while two DRAMs 460 (480) and 470 (490) are illustrated in FIG. 4 for each of the modules 440 and 450, additional DRAMs may be mounted in each of the first and second memory modules 440 and 450. Also, each of the chipset 410 and the DRAMs 460, 470, 480 and 490 are equipped with a driver 401 and an input buffers 402 for the writing and reading of data.

The chipset 410 includes an active terminator 430 which is enabled and disabled by an ATC_Chip_Set (ATC_CS) signal. In addition, each of the DRAMs 460 and 470 of the module 440 includes an active terminator 431 which is enabled and disabled by the ATC_0 signal, and each of the DRAMS 480 and 490 of the module 450 includes an active terminator 432 which is enabled and disabled by the ATC_1 signal. Further, the chipset 410 includes an ATC signal generator 411 which, as described herein below, generates a chipset control signal ATC_CS, a first control signal ATC_0, and a second control signal ATC_1 according to read/write modes of the memory modules 440 and 450.

Generally, when data is written to or read from the DRAMs 460 and 470, the chipset 410 outputs a data write/read command to the DRAMs 460 and 470 mounted in the first memory module 440. In addition, the chipset 410 outputs the first control signal ATC_0 to the DRAMs 460 and 470 for disabling the active terminator 431 of the DRAMs 460 and 470, and outputs the second control signal ATC_1 to the DRAMs 480 and 490 for enabling the active terminators 432 of the DRAMs 480 and 490.

In other words, the active terminators of a memory module which is being subjected to a data write or read operation are disabled, and the active terminators of the other memory module(s) in which data is neither written nor read are enabled. In addition, however, according to the present embodiment, the active terminators are selectively asynchronously or synchronously controlled according to an operational mode of each memory module. Herein, the phrase "operational mode" refers to, for example, active, power-down and standby modes of the memory module.

"Synchronous ATC mode" refers to a mode in which the active terminator of a DRAM is enabled or disabled in synchronization with the external clock signal CLK when the DLL or PLL of the DRAM is activated. In other words, the termination resistors of the DRAMs are enabled or disabled in synchronization with the external clock CLK in this control mode.

"Asynchronous ATC mode" refers to a mode in which the termination resistor of a DRAM is enabled or disabled asynchronously with the external clock signal CLK when the DLL or PLL of the DRAM is deactivated (in a power down (Pdn) mode or standby (Stby) mode). In other words, the termination resistors of the DRAMs are enabled or disabled asynchronously with the external clock CLK in this control mode.

Figures 5A, 5B:
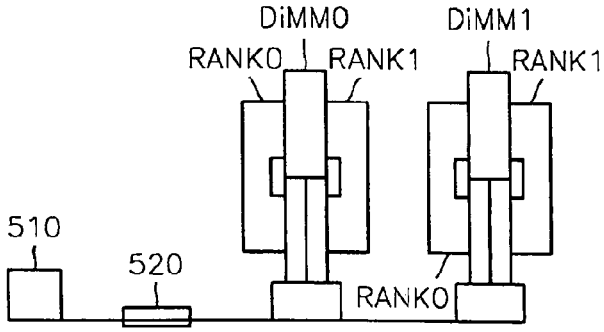
FIG. 5A shows a first memory system according to the present invention in which dual in-line modules (DiMM) are mounted.
FIG. 5B is a table of control modes of the first memory system of FIG. 5A.

For example, referring to FIG. 5A, DiMM0 and DiMM1 denote first and second dual in-line memory modules, respectively. Each module is equipped with DRAMs (rank 0 and rank 1) as shown, and is connected to a chipset 510 by way of a data bus 520. In addition, each of the DRAMs includes a synchronization circuit, for example, a delay locked loop (DLL) or phase locked loop (PLL), for generating an internal clock in synchronization with an external clock CLK. A detailed description of operation of the DLL and PLL is omitted here since these circuits are well known to those skilled in the art.

FIG. 5B is a table showing the status of the DLL or PLL described above and control modes of the active terminator. As shown in FIG. 5B, the active terminator of a module is asynchronously controlled when each of the memory modules DiMM0 and DiMM1 is in a power down or standby mode, and the active terminator of a module is synchronously controlled when each of the memory modules DiMM0 and DiMM1 is in an active mode. Whether a module is in an active mode, standby mode, or power down mode, may be determined from the status of the DLL or PLL of the memory module.

As such, when both memory modules DiMM0 and DiMM1 are in an active state, the active terminator of both modules is synchronously controlled. When one of the modules is in a power down or standby mode (Pdn/stby) while the other is in an active mode, the active terminator of the one module is asynchronously controlled. In this manner, the enabling/disabling of the active terminator can be controlled in the case where the DLL or PLL is deactivated during a power down or standby mode of a corresponding memory module. Accordingly, it not necessary to first activate the DLL or PLL prior to initiating control of the active terminator.

Figures 5C, 5D:
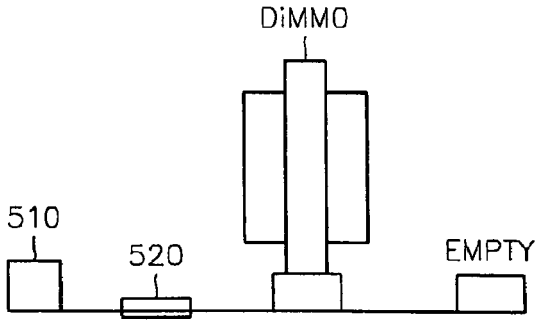
FIG. 5C shows a second memory system according to the present invention in which memory modules DiMMs are mounted.
FIG. 5D is a table of control modes of the second memory system of FIG. 5C.

FIG. 5C illustrates the case where the module DiMM1 of the memory system is empty, and FIG. 5D is a table showing the status of the DLL or PLL and control modes of the active terminator in the case where either one of the DiMM0 or DiMM1 modules is empty.

Figure 6:
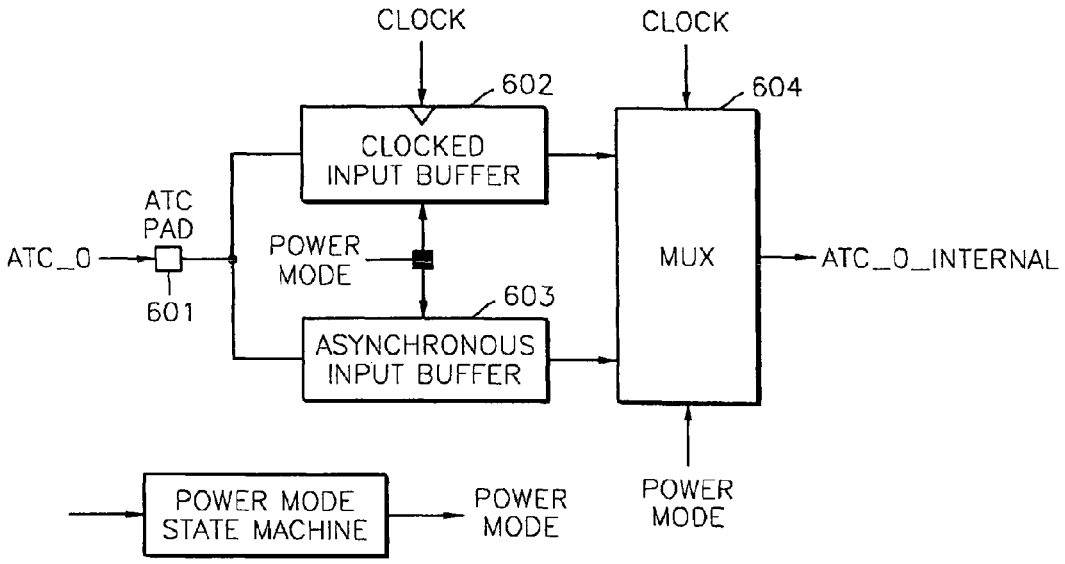
FIG. 6 illustrates an active terminator control input buffer according to the present invention.

Referring now to FIG. 6, a functional diagram of a synchronous and asynchronous active terminator control (ATC) input buffer of the present invention is shown. An ATC pad 601 receives a first control signal ATC_0 from the chipset 410 (FIG. 4). The first control signal ATC_0 is applied in parallel to a clocked (synchronous) input buffer 602 and an asynchronous input buffer 603. A multiplexer (MUX) 604 effectively selects one of an output of the synchronous input buffer 602 or an output of the asynchronous input buffer 603 according to an operational mode signal (POWER MODE) applied thereto.

In addition, the operational mode signal, which is supplied from an operational mode (power mode) state machine of the memory system, is also used to operatively enable/disable the buffers 602 and 603. The ATC input buffer of FIG. 6 operates as described above with reference to FIGS. 5B and 5D to selectively control the active terminators of the memory modules in either a synchronous or asynchronous mode.

Figure 7A:
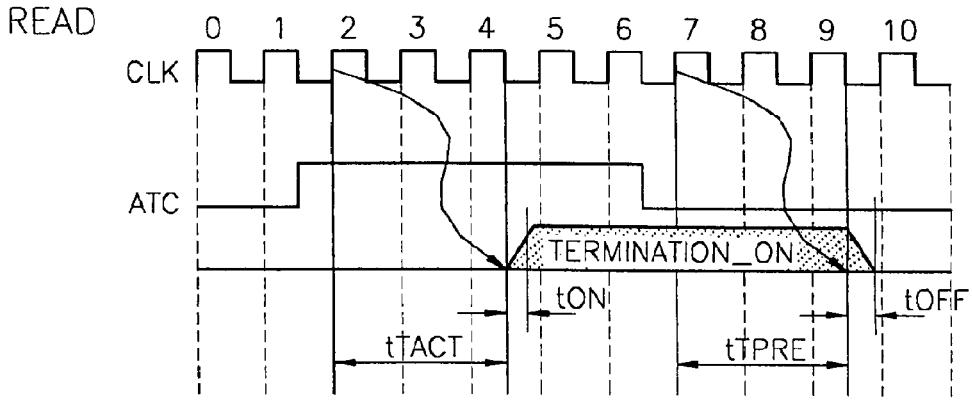
FIGS. 7A and 7B are timing diagrams of a synchronous active termination resistor control (ATC) mode during read and write operations, respectively.
Figure 7B:
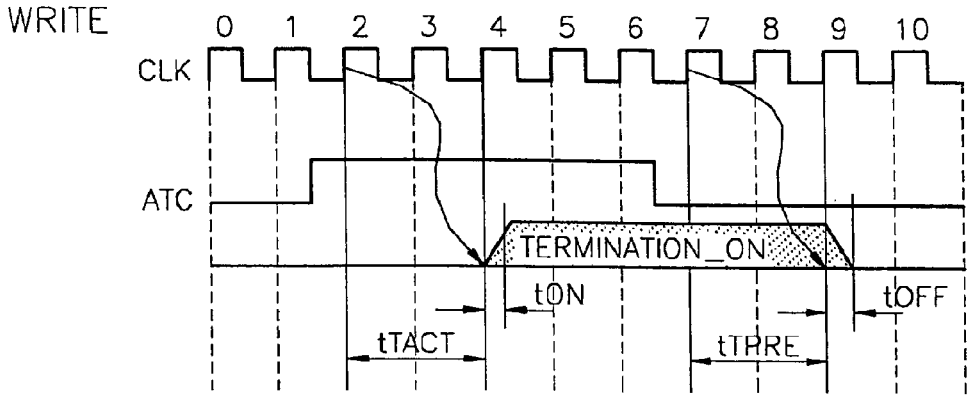

ATC control in a synchronous mode for each of a read operation and a write operation is illustrated in the timing charts of FIGS. 7A and 7B, respectively. It is assumed here that data is written with reference to a clock center, data is read with reference to a clock edge, and that the DRAMs operate at a double data rate with a burst length of 8.

The active terminators of the DRAMs are enabled preferably within a second time period tON following a first time period tTACT counted from the activation of the control signal ATC output from the chipset 410. The active terminators of the DRAMs are disabled preferably within a fourth time period tOFF following a third time period tTPRE counted from the deactivation of the control signal ATC. The first time period tTACT and the third time period tTPRE are set as an absolute time length which is not based on the external clock signal CLK.

Referring first to the read operation of FIG. 7A, the ATC is responsive at the rising edge of CLK 2 to a "high" state of the ATC signal to enable the active terminator after a delay period tTACT. In this case, the enabling of the active terminator is synchronized with the falling edge of CLK 4 as shown, and the active terminator is considered to be "on" after a further delay time tON.

Then, the ATC is responsive at the rising edge of CLK 7 to a "low" state of the ATC signal to disable the active terminator after a delay period tTPRE. Again, the disabling of the active terminator is synchronized with the falling edge of CLK 9 as shown, and the active terminator is considered to be "off" after a further delay time tOFF. In this example, the following relationships may be established:

$$2.5tCC-500\text{ ps}<tTACT,tTPRE<2.5tCC+500\text{ ps}$$

where tCC is a clock cycle time. Also, the time period tON and/or the time period tOFF may be set to be less than 2.5*tCC−500 ps.

Referring now to the write operation of FIG. 7B, the ATC is responsive at the rising edge of CLK 2 to a "high" state of the ATC signal to enable the active terminator after a delay period tTACT. In this case, the enabling of the active terminator is synchronized with the rising edge of CLK 4 as shown, and the active terminator is considered to be "on" after a further delay time tON. Then, the ATC is responsive at the rising edge of CLK 7 to a "low" state of the ATC signal to disable the active terminator after a delay period tTPRE. Again, the disabling of the active terminator is synchronized with the rising edge of CLK 9 as shown, and the active terminator is considered to be "off" after a further delay time tOFF. In this example, the following relationships may be established:

$$2.0tCC-500\ ps<tTACT,tTPRE<2.0tCC+500\ ps$$

where tCC is a clock cycle time. Also, the time period tON and/or the time period tOFF may be set to be less than 0.5*tCC−500 ps.

Figure 8:
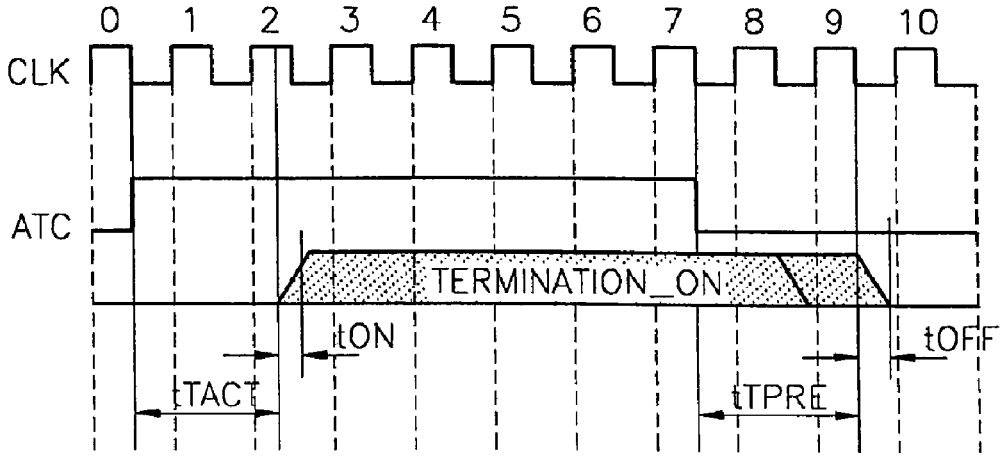
FIG. 8 is a timing diagram of an asynchronous ATC mode.

ATC control in an asynchronous mode is illustrated in the timing chart of FIG. 8. Here, the ATC is responsive to a "high" state of the ATC signal to enable the active terminator after a delay period tTACT. Note here that the enabling of the active terminator is not synchronized with the clock signal, but is instead determined by the amount of the delay tTACT. As before, the active terminator is considered to be "on" after a further delay time tON.

The ATC is then responsive to a "low" state of the ATC signal to disable the active terminator after a delay period tTPRE. Again, the disabling of the active terminator is not synchronized with the clock signal, but is instead determined by the amount of the delay tTPRE, and the active terminator is considered to be "off" after a further delay time tON. Here, for example, tTACT and tTPRE may be set between 2.5 ns and 5.0 ns. Also, the time period tON and/or the time period tOFF may be set to be less than 0.5*tCC−500 ps.

Figure 9A:
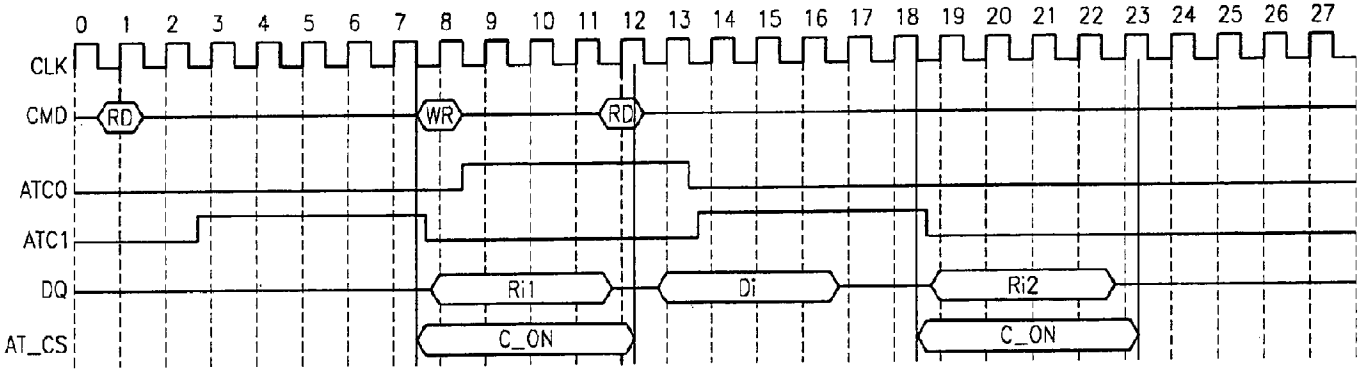
FIGS. 9A through 9C are timing charts of an operation of the memory system when both modules DiMM0 and DiMM1 are in an active mode.
Figure 9B:
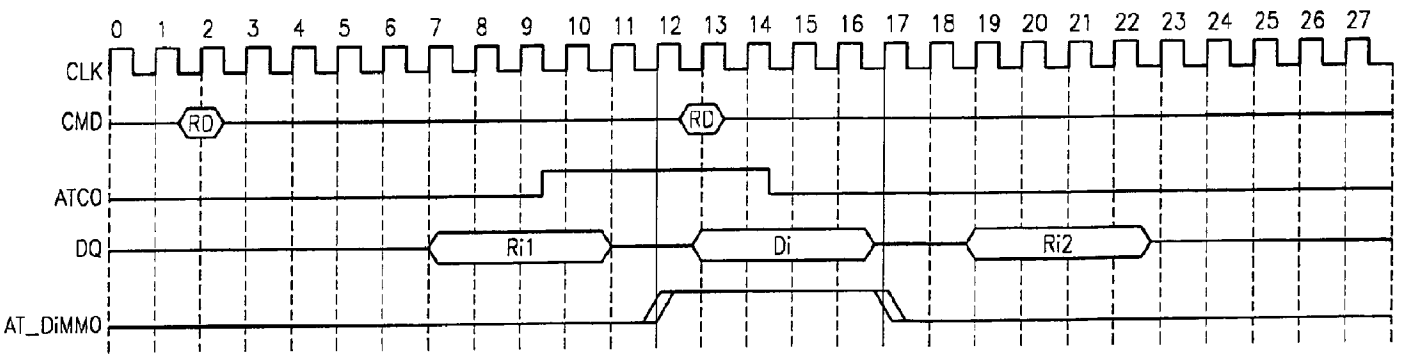
Figure 9C:
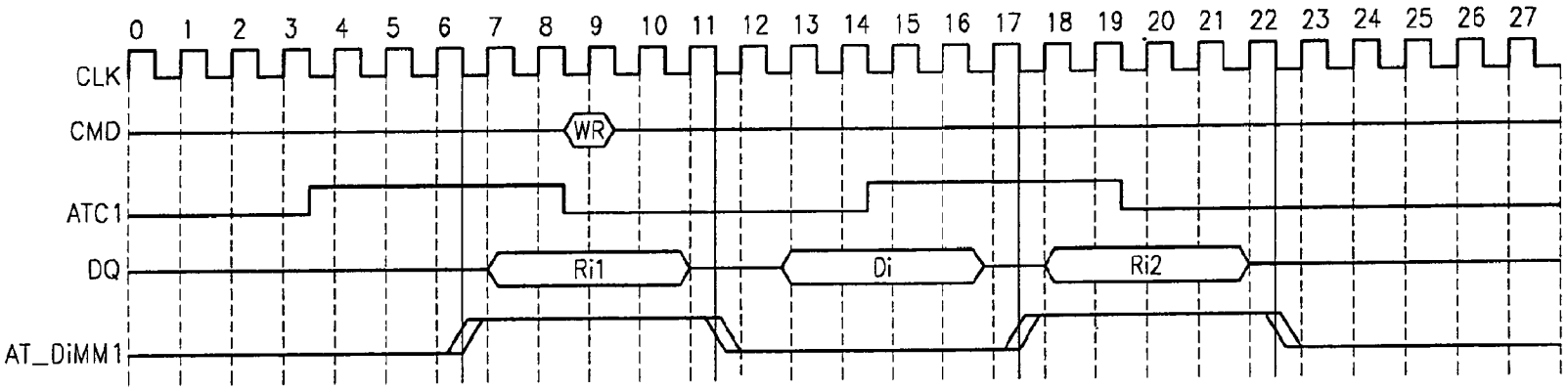

FIGS. 9A through 9C are timing charts of an operation of the memory system when both memory modules DiMM0 and DiMM1 are in an active mode. Since both modules are active, as shown in FIG. 5B, the ATC of each is carried out in a synchronous mode. FIG. 9A illustrates the operation of the chipset, FIG. 9B illustrates the operation of the first memory module DiMM0, and FIG. 9C illustrates the operation of the second memory module DiMM1. As shown, the chipset issues a sequence of commands including a read command RD to the DiMM0, a write command WR to the DiMM1, and another read command RD to the DiMM0.

To read the first memory module DiMM0, the active terminator of the second memory module DiMM1 must be enabled. Accordingly, the chipset outputs the read command RD to the first memory module DiMM0 and outputs the second control signal ACT1 to the second memory module DiMM1. The second memory module DiMM1 is responsive to the second control signal ATC1 to temporarily enable the active terminator thereof as shown by the active terminator AT_DiMM1 of FIG. 9C. Also, during the period in which the active terminator of the second module DiMM1 is enabled, data Ri1 is read from the first memory module DiMM0.

Likewise, to next write the second memory module DiMM1, the active terminator of the first memory module DiMM0 must be enabled. Accordingly, the write command WR is input to the second memory module DiMM1, and the first control signal ACT0 output from the chipset is input to the first memory module DiMM0. The first memory module DiMM0 is responsive to the first control signal ATC0 to temporarily enable the active terminator thereof as shown by the active terminator AT_DiMM0 of FIG. 9B. Also, during the period in which the active terminator of the first memory module DiMM0 is enabled, data Di is written to the second memory module DiMM1.

The second read operation of the first memory module DiMM0 is carried out in the same manner as the first read operation, with the second memory module DiMM1 being responsive to the second control signal ACT1 to enable the active terminator AT_DiMM1 of FIG. 9C.

Note also in FIG. 9A that the active terminator AT_CS of the chip-set is enabled only during the memory read operations. Active termination is not necessary in a write operation in the case where there is impedance matching of drivers.

Figure 10A:
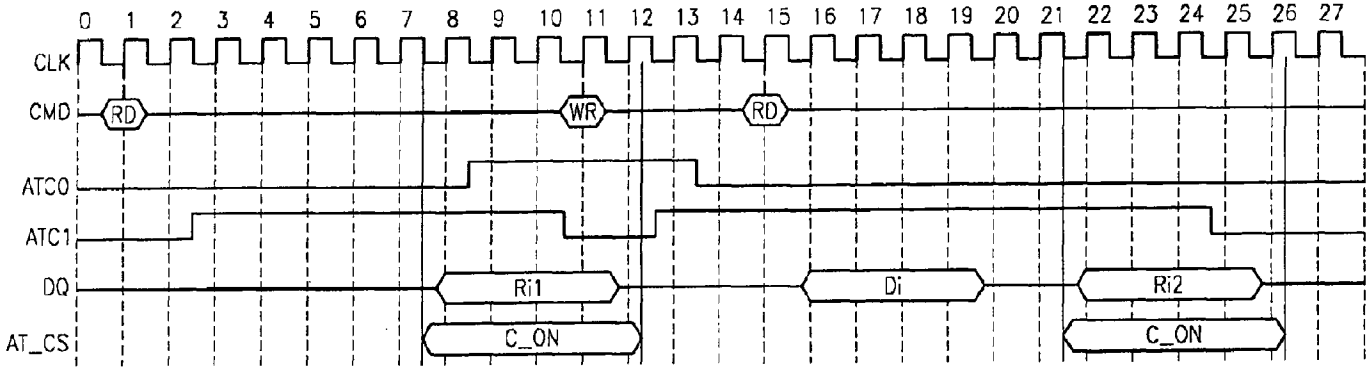
FIGS. 10A through 10C are timing charts of an operation of the memory system when the DiMM0 is in an active mode, and the DiMM1 is in a power down or standby mode.
Figure 10B:
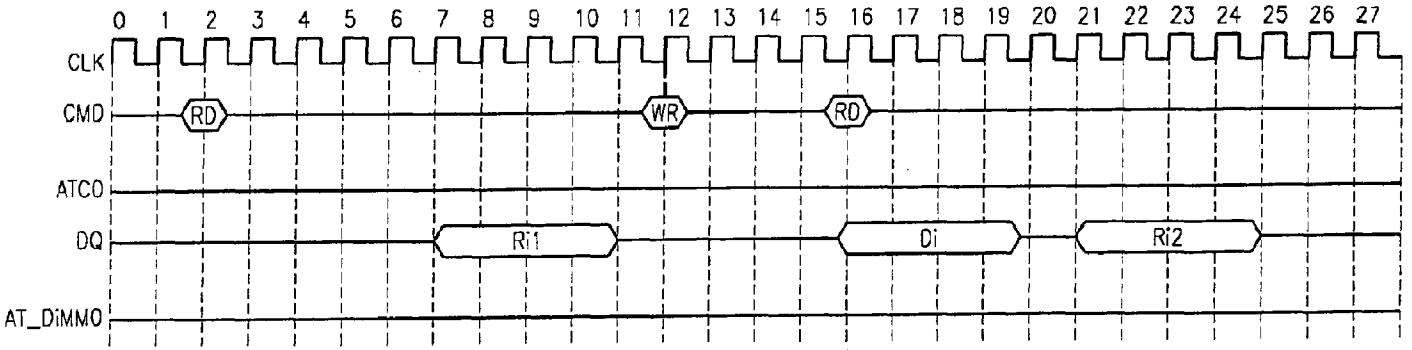
Figure 10C:
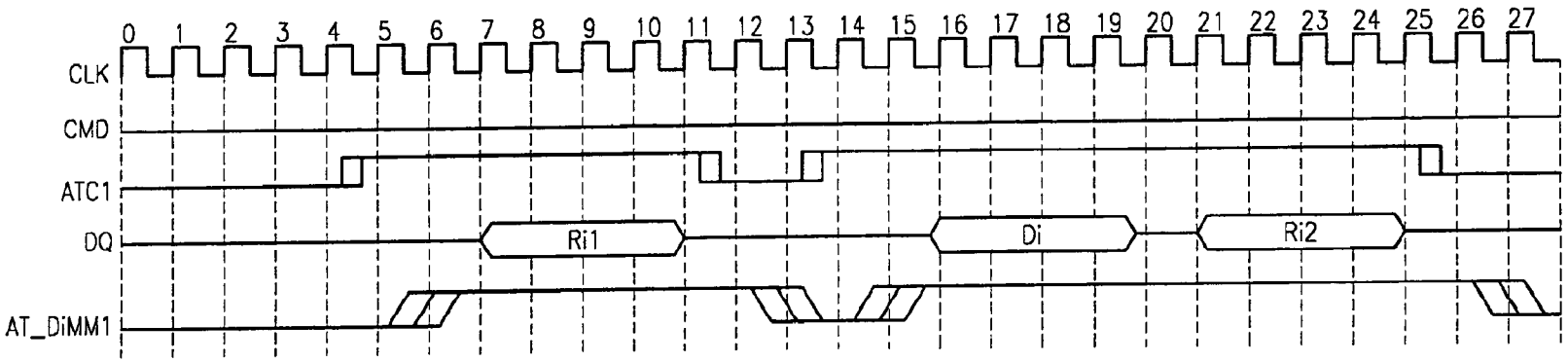

FIGS. 10A through 10C are timing charts of an operation of the memory system when the first memory module DiMM0 is in an active mode, and the second memory module DiMM1 is in a power down or standby mode. In this case, as shown in FIG. 5B, the ATC of the first memory module DiMM0 is off, and ATC of the second memory module DiMM1 is carried out in an asynchronous mode. FIG. 10A illustrates the operation of the chipset, FIG. 10B illustrates the operation of the first memory module DiMM0, and FIG. 10C illustrates the operation of the second memory module DiMM1. As shown, the chipset issues a sequence of commands to the active first memory module DiMM0, including a read command RD to the DiMM0, a write command WR to the DiMM0, and another read command RD to the DiMM0.

To read the first memory module DiMM0, the active terminator of the second memory module DiMM1 must be enabled. Accordingly, the first read command RD output from the chipset is input to the first memory module DiMM0, and the second control signal ATC1 output from the chip set is input to the second memory module DiMM1. As shown, the second memory module DiMM1 is asynchronously responsive to the second control signal ATC1 to temporarily enable the active terminator thereof as shown by the active terminator AT_DiMM1 of FIG. 10C. Also, during the period in which the active terminator of the second memory module DiMM1 is enabled, data Ri1 is read from the first memory module DiMM0.

Likewise, to next write the first memory module DiMM0, the active terminator of the second memory module DiMM1 must be enabled. Accordingly, the write command WR output from the chipset is input to the first memory module DiMM0, and the second control signal ACT1 is input to the second memory module DiMM1. The first memory module DiMM0 is again asynchronously responsive to the second control signal ATC1 to enable the active terminator thereof as shown by the active terminator AT_DiMM1 of FIG. 10C. At this time, data Di is written to the first memory module DiMM0.

In the example of FIGS. 10A through 10C, the second read command RD follows closely after the write command WR. As such, the second control signal ACT1 remains high, and the active terminator of the second memory module DiMM1 remains enabled throughout the second read operation. Note also, as is apparent from FIG. 10C, the disabling of the active terminator of the second memory module DiMM1 is asynchronous as well.

Figure 11:
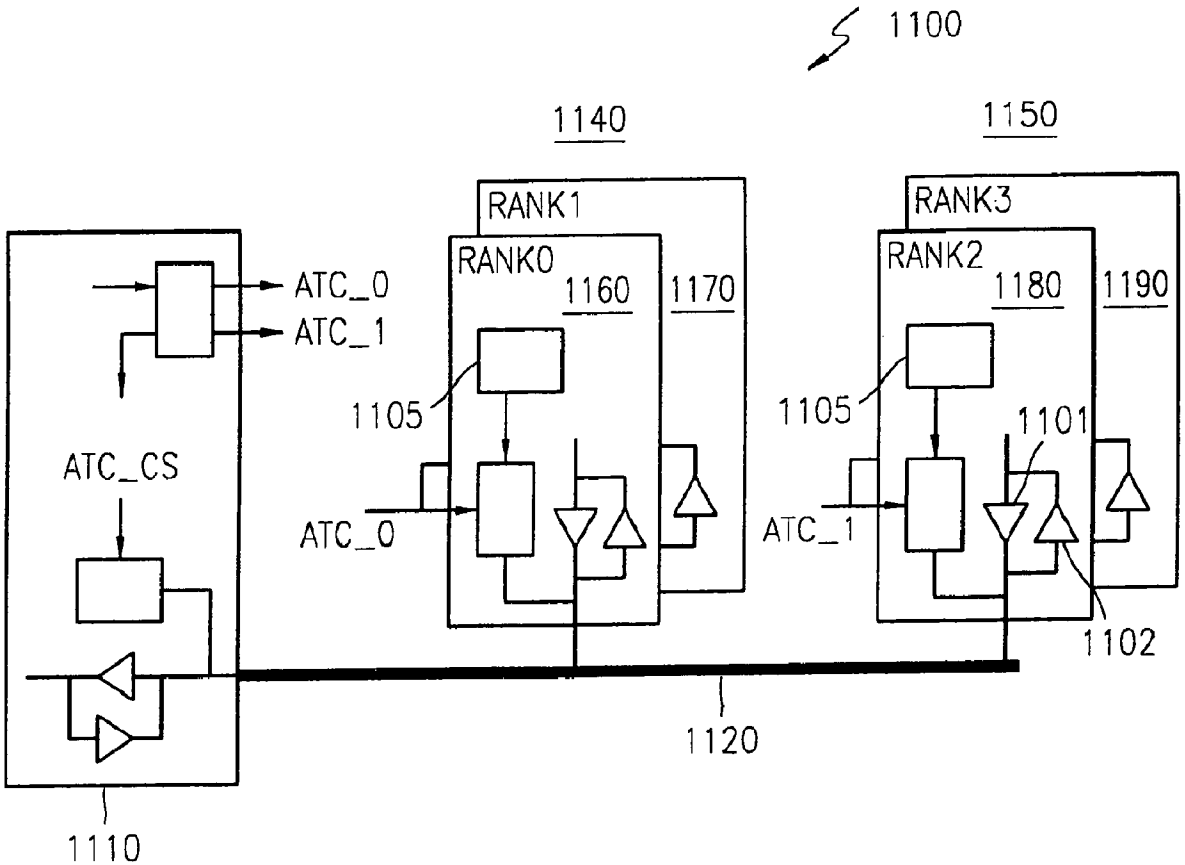
FIG. 11 shows a memory system according to another embodiment of the present invention having an active-termination stub bus configuration.

A second embodiment of the present invention will now be described with initial reference to FIG. 11 of the drawings. In this embodiment, DRAM chips positioned on each side of each DiMM module are individually ATC controlled by the combination of common ATC signaling and mode registers. In particular, as shown in FIG. 11, the memory system 1100 includes a chipset 1110, a data bus 1120, a first memory module 1140 in which DRAMs 1160 and 1170 are mounted, and a second memory module 1150 in which DRAMs 1180 and 1190 are mounted. The memory modules 1140 and 1150 may be mounted in card slots (not shown) of the memory system 1100.

The first and second memory modules 1140 and 1150 may be implemented, for example, by a dual in-line memory module (DiMM). Further, while two DRAMs 1160 (1180) and 1170 (1190) are illustrated in FIG. 11 for each of the modules 1140 and 1150, additional DRAMs may be mounted in each of the first and second memory modules 1140 and 1150. Also, each of the chipset 1110 and the DRAMs 1160, 1170, 1180 and 1190 are equipped with a driver 1101 and an input buffer 1102 for the writing and reading of data.

In contrast to the first embodiment, the DRAMs 1160, 1170, 1180 and 1190 are additionally equipped with a mode register 1105 which includes data indicative of the operational mode (active, power down, standby) of a corresponding DRAM. In a manner described below with reference to FIGS. 12A through 12E, the output of each register controls the operation of the MUX 604 of each ATC control circuit shown in FIG. 6 to thereby select a synchronous or asynchronous control mode.

Figure 13:
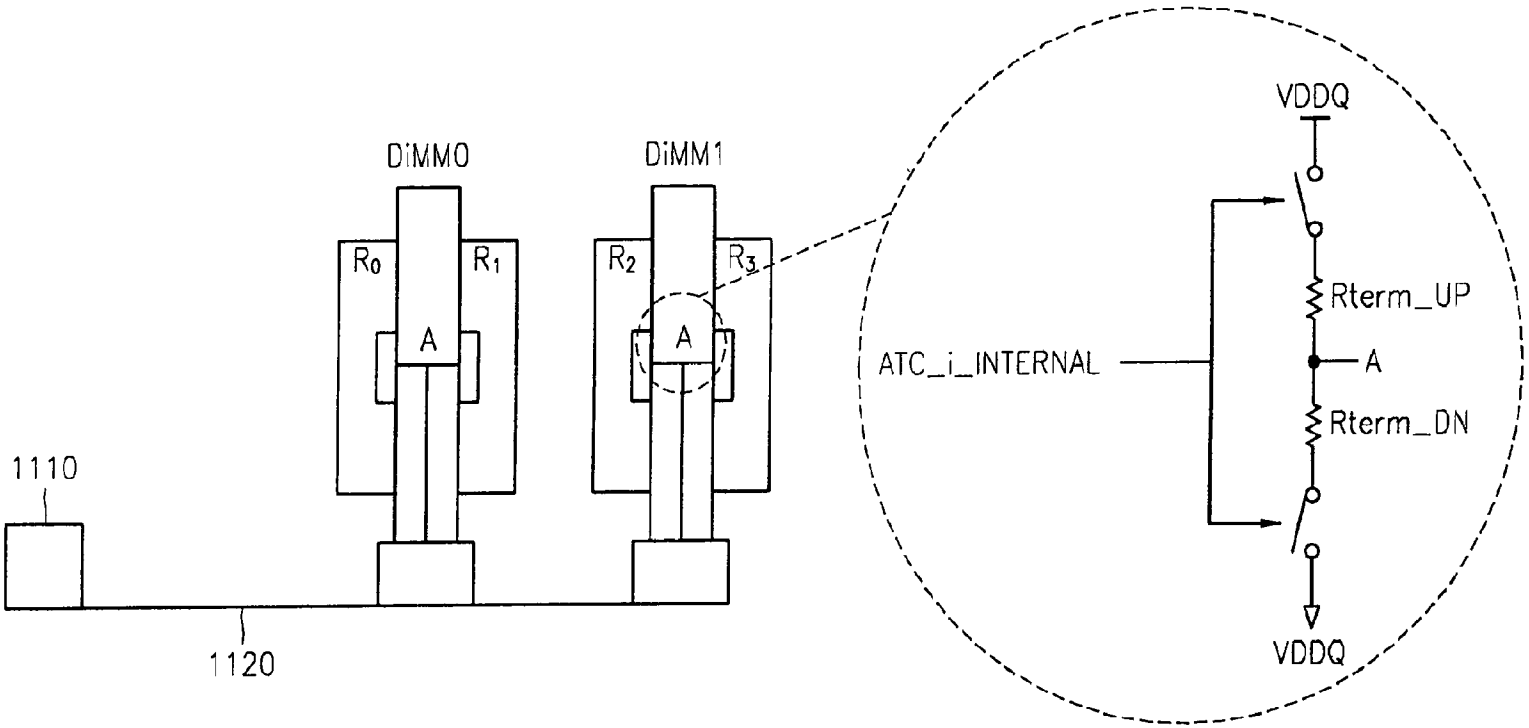
FIGS. 13 through 17 show memory systems according to the present invention in which different DiMMs are mounted.

FIG. 13 illustrates a "2r/2r" configuration in which each of the first and second memory modules DiMM0 and DiMM1 are equipped with two DRAM circuits. In this case, the active terminator control (ATC) of the memory system is carried out as shown below in FIG. 12A. Here, Rank 0 (R0) designates DRAM 1160, Rank 1 (R1) designates DRAM 1170, Rank 2 (R2) designates DRAM 1180, and Rank 3 (R3) designates DRAM 1190.

In FIG. 12A, "Off(flag)" means that the termination resistors are disabled exclusively by the setting of the flag, and "Off(ATC or flag)" means that the termination resistors are disabled selectively by the user's setting of the control signal or the flag.

When the mode registers indicate that all ranks are active, both the first and second memory modules DiMM0 and the DiMM1 are operated in a synchronous ATC mode. On the other hand, for example, when R3 is in a pdn/stby mode, ATC of R3 is turned off (or flagged) and the remaining ranks R0 through R2 are operated in a synchronous ATC mode. Further, when both R2 and R3 are in a pdn/stby mode, then ATC of the first memory module DiMM0 is turned off, and the ranks R2 and R3 of the second memory module DiMM1 are operated in an asynchronous ATC mode.

Figure 14:
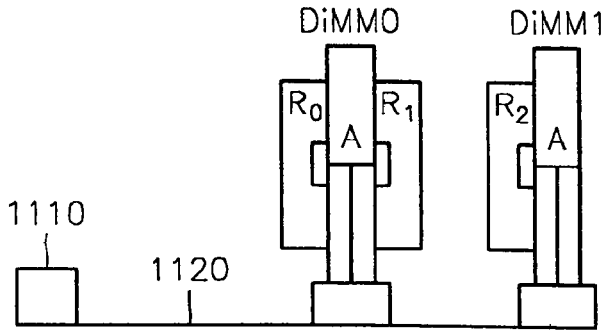

FIG. 14 illustrates a "2r/1r" configuration in which the first memory module DiMM0 is equipped with two DRAM circuits, and the second memory module DiMM1 is equipped with one DRAM circuit. In this case, the active terminator control (ATC) of the memory system is carried out as shown in FIG. 12B. Here, Rank 0 (R0) designates DRAM 1160, Rank 1 (R1) designates DRAM 1170, and Rank 2 (R2) designates DRAM 1180.

Figure 15:
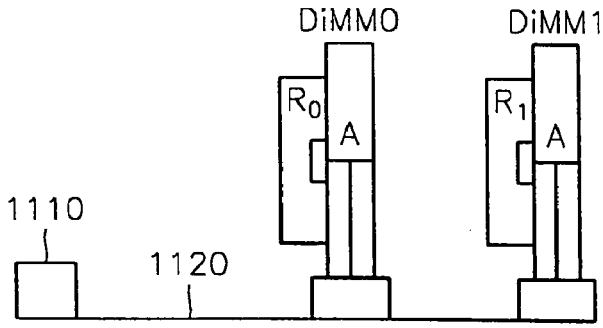

FIG. 15 illustrates a "1r/1r" configuration in which the first memory module DiMM0 is equipped with one DRAM circuit, and the second memory module DiMM1 is equipped with one DRAM circuit. In this case, the active terminator control (ATC) of the memory system is carried out as shown in FIG. 12C. Here, Rank 0 (R0) designates DRAM 1160 of the first memory module DiMM0, and Rank 1 (R1) designates DRAM 1180 of the second memory module DiMM1.

Figure 16:
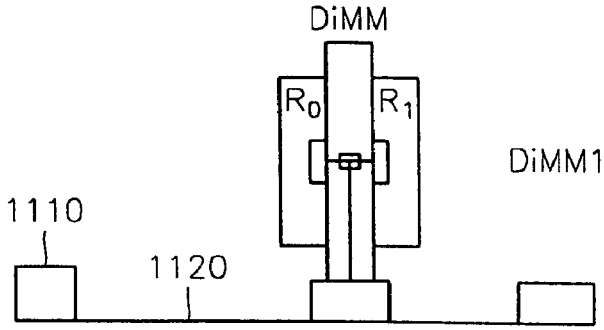

FIG. 16 illustrates a "2r/empty" configuration in which the first memory module DiMM0 is equipped with two DRAM circuits, and the second memory module DiMM1 is equipped with no DRAM circuits. In this case, the active terminator control (ATC) of the memory system is carried out as shown in FIG. 12D. Here, Rank 0 (R0) designates DRAM 1160 of the first memory module DiMM0, and Rank 1 (R1) designates DRAM 1170 of the first memory module DiMM0.

Figure 17:
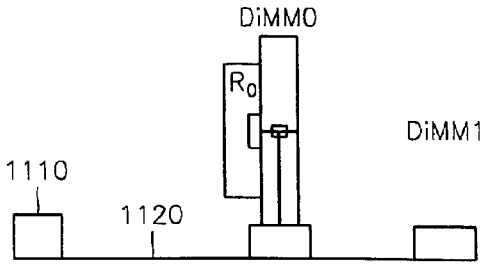

FIG. 17 illustrates a "1r/empty" configuration in which the first memory module DiMM0 is equipped with one DRAM circuit, and the second memory module DiMM1 is equipped with no DRAM circuits. In this case, the active terminator control (ATC) of the memory system is carried out such that when R0 is active, synchronous ATC is carried out, and when R0 is in Pdn/sdby mode, ATC is off. Here, Rank 0 (R0) designates the DRAM 1160 of the first memory module DiMM0.

Figure 18:
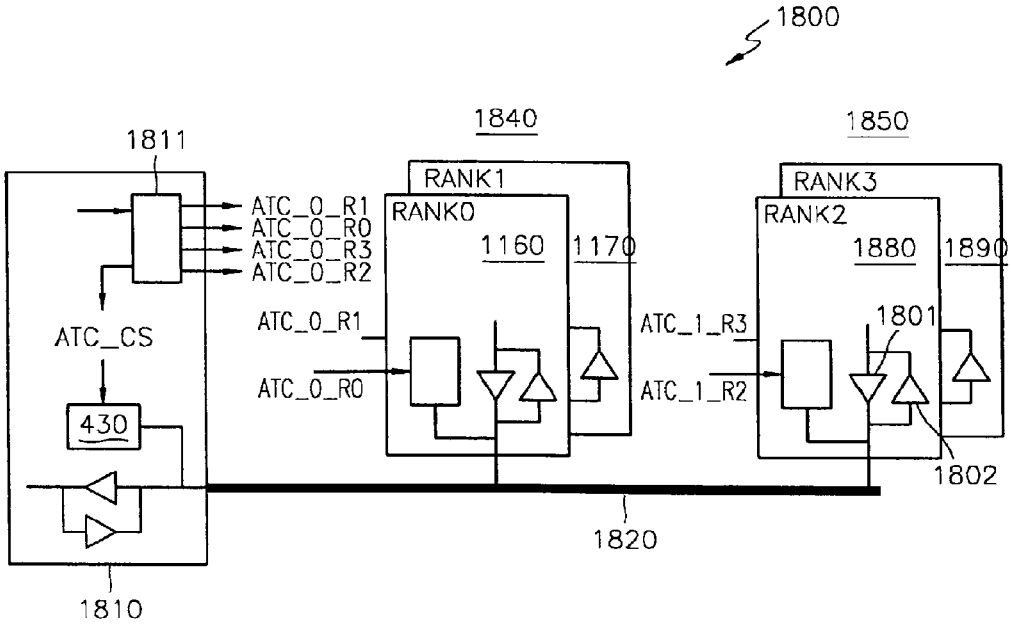
FIG. 18 shows another embodiment of the memory system according to the present invention having an active-termination stub bus configuration.

A third embodiment of the present invention will now be described with reference to FIG. 18 of the drawings. In this embodiment, DRAM chips 1860 (1880) and 1870 (1890) positioned on each side of each of the memory modules DiMM are individually ATC controlled by individual ATC signals issued from the chipset. In particular, as shown in FIG. 18, the memory system 1800 includes a chipset 1810, a data bus 1820, a first memory module 1840 in which DRAMs 1860 and 1870 are mounted, and a second memory module 1850 in which DRAMs 1880 and 1890 are mounted. The memory modules 1840 and 1850 may be mounted in card slots (not shown) of the memory system 1800.

The first and second memory modules 1840 and 1850 may be implemented, for example, by a dual in-line memory module (DiMM). Further, while two DRAMs 1860 (1880) and 1870 (1890) are illustrated in FIG. 18 for each of the modules 1840 and 1850, additional DRAMs may be mounted in each of the first and second memory modules 1840 and 1850. Also, each of the chipset 1810 and the DRAMs 1860, 1870, 1880 and 1890 are equipped with a driver 1801 and an input buffer 1802 for the writing and reading of data.

In contrast to the first and second embodiments, the ATC signal generator 1811 of the present embodiment shown in FIG. 18 supplies individual ATC signals ATC_0_R0 and ATC_0_R1 to the DRAMs 1860 and 1870 of the first memory module 1840 (DiMM0), and further supplies individual ATC signals ATC_1_R2 and ATC_1_R3 to the DRAMs 1880 and 1890 of the second memory module 1850 (DiMM1). In a manner described in FIG. 12E, the operation of the MUX 604 of each ATC control circuit shown in FIG. 6 it controlled to thereby select a synchronous or asynchronous control mode on the basis of the operational states of each individual DRAM (or rank).

In particular, FIG. 12E corresponds to the "2r/2r" configuration of FIG. 13 in which each of the first and second memory modules DiMM0 and DiMM1 are equipped with two DRAM circuits. Here, Rank 0 (R0) designates DRAM 1860, Rank 1 (R1) designates DRAM 1870, Rank 2 (R2) designates DRAM 1880, and Rank 3 (R3) designates DRAM 1890.

Figure 19:
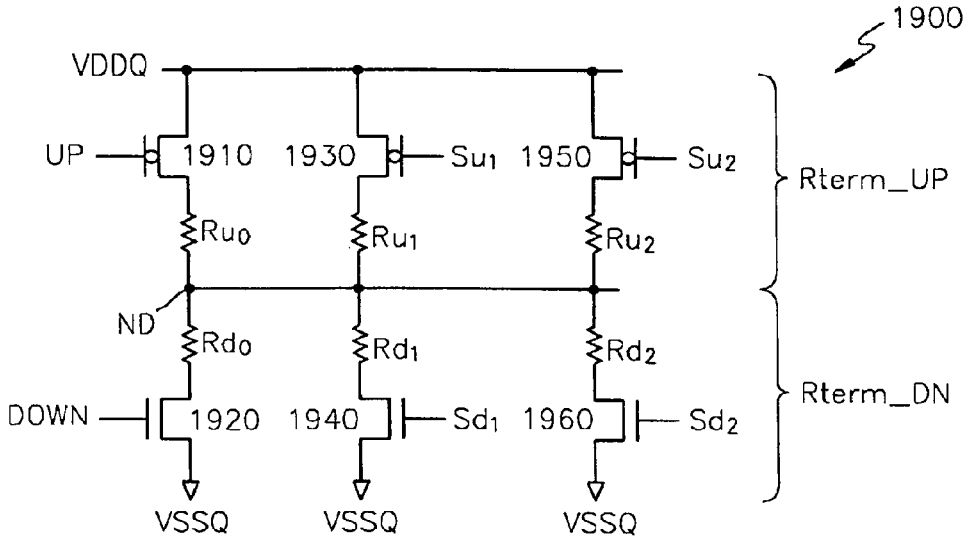
FIG. 19 is a detailed circuit diagram of the termination resistor of FIG. 13.

FIG. 19 is a detailed circuit diagram of termination resistors Rterm_UP and Rterm_DN shown in FIG. 13. Referring to FIG. 19, a first UP resistor Ru0 is coupled to a power voltage VDDQ via a PMOS transistor 1910 and to a node ND (node A shown in FIG. 13). A second UP resistor Ru1 is coupled to the power voltage VDDQ via a PMOS transistor 1930 and to the node ND, and a third UP resistor Ru2 is coupled to the power voltage VDDQ via a PMOS transistor 1950 and to the node ND.

The PMOS transistors 1910, 1930, and 1950 are turned on or off in response to control signals UP, SU1 and SU2, respectively.

Preferably, a DRAM is designed such that the resistance of each of the first, second, and third UP resistors Ru0, Ru1, and Ru2 is set as follows. The resistance of the first UP resistor Ru0 is set to be slightly greater than a predetermined target value. The resistance of the second UP resistor Ru1 is set to the predetermined target value when connected in parallel to the first UP resistor Ru0. The resistance of the third UP resistor Ru2 is set to be slightly lower than the predetermined target value when connected in parallel to the first UP resistor Ru0 and the second UP resistor Ru1. Accordingly, the resistance of the termination resistor Rterm_UP is determined by the combination of the first, second, and third UP resistors Ru0, Ru1, and Ru2.

The first DOWN resistor Rd0 is coupled to the node ND and to a ground voltage VSSQ via an NMOS transistor 1920, the second DOWN resistor Rd1 is coupled to the node ND and to the ground voltage VSSQ via an NMOS transistor 1940, and the third DOWN resistor Rd2 is coupled to the node ND and to the ground voltage VSSQ via an NNOS transistor 1960.

The NMOS transistors 1920, 1940, and 1960 are turned on or off in response to control signals DOWN, SD1 and SD2, respectively.

It is preferable that the MOS transistor 1930 and 1940 are turned on and the MOS transistors 1950 and 1950 are turned off in a default situation. Alternatively, the MOS transistor 1930 and 1940 may be turned off and the MOS transistors 1950 and 1950 are turned on in a default situation.

Preferably, a DRAM is designed such that the resistance of each of the first, second, and third DOWN resistors Rd0, Rd1, and Rd2 is set as follows. The resistance of the first DOWN resistor Rd0 is set to be slightly greater than a predetermined target value. The resistance of the second DOWN resistor Rd1 is set to the predetermined target value when connected in parallel to the first DOWN resistor Rd0. The resistance of the third DOWN resistor Rd2 is set to be slightly lower than the predetermined target value when connected in parallel to the first DOWN resistor Rd0 and the second DOWN resistor Ru2. Accordingly, the resistance of the termination resistor Rterm_DN is determined by the combination of the first, second, and third DOWN resistors Rd0, Rd1, and Rd2.

Figure 20:
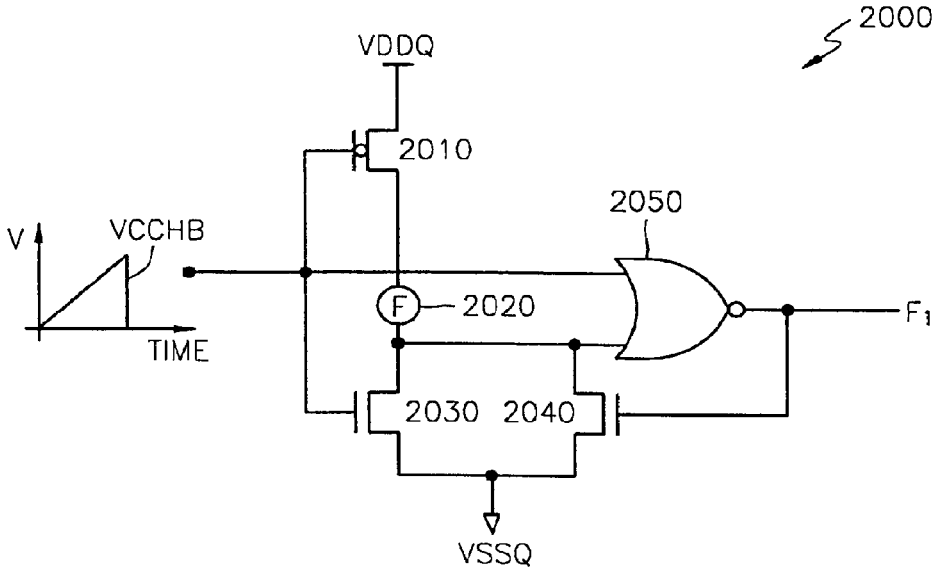
FIG. 20 shows an example of a control signal generating circuit having a fuse.

FIG. 20 shows an example of a control signal generating circuit having a fuse. Referring to FIG. 20, a control signal generating circuit 2000 includes a plurality of transistors 2010, 2030, and 2040, a fuse 2020, and a logic gate 2050.

The PMOS transistor 2010 is coupled between a power voltage VDDQ and one end of the fuse 2020. A power-up signal VCCHB is input to a gate of the PMOS transistor 2010. The NMOS transistor 2030 is connected between the other end of the fuse 220 and a ground voltage VSSQ. The power-up signal VCCHB is input to a gate of the NMOS transistor 2030. As shown in FIG. 20, the level of the power-up signal VCCHB increases for a predetermined time period and then drops and is maintained at a low level.

The fuse 2020 is connected between a drain of the PMOS transistor 1020 and a drain of the NMOS transistor 2030. The fuse 2020 can be cut by a variety of methods, for example, using a laser. The fuse 2020 may be implemented with a make-link or an anti-fuse.

The logic gate 2050 receives the power-up signal VCCHB and a signal from the drain of the NMOS transistor 2030, performs an NOR operation, and outputs the result F1.

The NMOS transistor 2040 is connected between the drain of the NMOS transistor 2030 and the ground voltage VSSQ and has a gate connected to an output of the logic gate 2050.

Referring to FIG. 20, after a predetermined time period has elapsed from when the fuse 2020 is cut and the power-up signal VCCHB is applied, the output signal F1 of the logic gate 2050 is in a logic high state. In contrast, after a predetermined time period has elapsed from when the fuse 2020 is not cut and the power-up signal VCCHVB is applied, the output signal F1 of the logic gate 2050 is in a logic low state.

Figure 21:
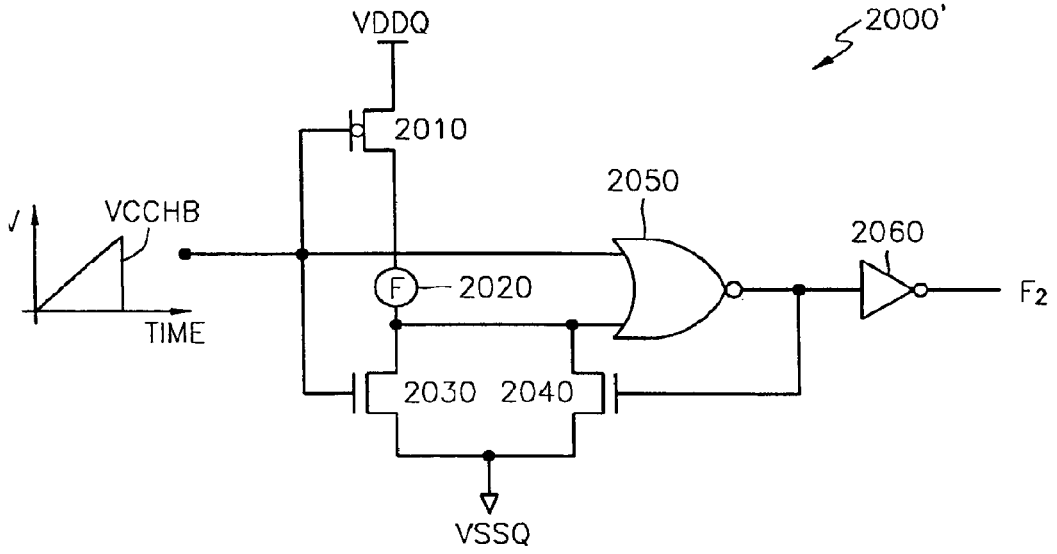
FIG. 21 shows another example of a control signal generating circuit having a fuse.

FIG. 21 shows another example of the control signal generating circuit having a fuse. Referring to FIG. 21, a control signal generating circuit 2000' further includes an inverter 2060 at an output terminal of the control signal generating circuit 2000 of FIG. 20. When the fuse 2020 of the control signal generating circuit 2000' is not cut, an output signal F2 of the inverter 2060 is in a logic high state. When the fuse 2020 of the control signal generating circuit 2000' is cut, the output signal F2 of the inverter 2060 is in a logic low state.

Tuning the resistance of the termination resistors Rterm_UP and Rterm_DN to a predetermined target value will be described in detail with reference to FIGS. 19 and 21. When all resistors Ru0, Ru1, Ru2, Rd0, Rd1, and Rd2 are mounted in a semiconductor chip, the resistance of the first UP resistor Ru0 and the resistance of the first DOWN resistor Rd0 are measured in a test mode using a tester.

Here, the resistance of the first UP resistor Ru0 may be different from that of the first DOWN resistor Rd0 due to variations in the manufacturing process. When there is a mismatch between the PMOS transistor 1910 and the NMOS transistor 1920, the resistance of the first UP resistor Ru0 may be different from that of the first DOWN resistor Rd0. Such a difference in the resistance between the first UP resistor Ru0 and the first DOWN resistor Ru0 degrades signal integrity.

When the resistance of the first UP resistor Ru0 is measured in the test mode, the NMOS transistors 1920, 1940, and 1960 are turned off. When the first DOWN resistor Rd0 is measured in the test mode, the PMOS transistors 1910, 1930, and 1950 are turned off.

The measured resistance of the first UP resistance Ru0 is compared with the predetermined target value of the terminal resistor Rterm_UP, and the fuse 2020 of FIGS. 20 and 21 are appropriately cut. The logic state of the output signals F1 and F2 is dependent upon whether or not the fuse 2020 is cut.

The initial state of signals input to the MOS transistors 1930, 1940, 1950, and 1960 is as follows. The gate of each of the MOS transistors 1930 and 1960 receives the output signal F1 of the control signal generating circuit 2000 of FIG. 20, and the gate of each of the MOS transistors 1940 and 1950 receives the output signal F2 of the control signal generating circuit 2000' of FIG. 21.

In the initial state where the fuse 2020 is not cut, the MOS transistors 1930 and 1940 are turned on, and the MOS transistors 1950 and 1960 are turned off.

When the measured resistance of the first UP resistor Ru0 is greater than the predetermined target value of the termination resistor Rterm_UP, and the fuse 2020 of the control signal generating circuit 2000' connected to the gate of the PMOS transistor 1950 is cut, the control signal Su2 is disabled (for example, in a logic low state). Accordingly, the third UP resistor Ru2 is connected in parallel to the first UP resistor Ru0 and the second UP resistor Ru1, and the resistance of the termination resistor Rterm_UP drops close to the predetermined target value.

In contrast, when the measured resistance of the first UP resistor Ru0 is smaller than the predetermined target value of the termination resistor Rterm_UP, and the fuse 2020 of the control signal generating circuit 2000 connected to the gate of the PMOS transistor 1930 is cut, the control signal Su1 is enabled, and the second UP resistor Ru1 is disconnected from the first UP resistor Ru0. Accordingly, the resistance of the termination resistor Rterm_UP increases close to the predetermined target value.

When the measured resistance of the first DOWN resistor Rd0 is greater than the predetermined target value of the termination resistor Rterm_DOWN, and the fuse 2020 of the control signal generating circuit 2000 connected to the gate of the NMOS transistor 1960 is cut, the control signal Sd2 is enabled. Accordingly, the third DOWN resistor Rd2 is connected in parallel to the first DOWN resistor Ru0 and the second DOWN resistor Rd1, and the resistance of the termination resistor Rterm_DN drops close to the predetermined target value.

In contrast, when the measured resistance of the first DOWN resistor Rd0 is smaller than the predetermined target value of the termination resistor Rterm_DOWN, and the fuse 2020 of the control signal generating circuit 2000' connected to the gate of the NMOS transistor 1940 is cut, the control signal Sd1 is disabled, and the second DOWN resistor Rd1 is disconnected from the first DOWN resistor Rd0. Accordingly, the resistance of the termination resistor Rterm_DB increases close to the predetermined target value.

Referring to FIG. 19, although the termination resistors Rterm_UP and Rterm_DN are illustrated as including two resistors Ru1 and Ru2, and Rd1 and Rd2, respectively, to tune the resistance thereof, this embodiment is for illustrative purposes and is not intended to limit the scope of the present invention. Alternatively, each of the termination resistors Rterm_UP and Rterm_DN may include a plurality of resistors to precisely tune the resistance thereof.

Whether or not the fuse 2020 is to be cut can be determined in the test mode using a predetermined look-up table.

According to the present invention, the control signals UP, Su1, Su2, DOWN, Sd1, and Sd2 can be generated using a mode register set (MRS). According to the present invention, the resistance of each of the termination resistors Rterm_UP and Rterm_DN can be tuned to a predetermined target value in a chip-test process or after chip packaging.

According to the present invention, the resistance of each of the termination resistors Rterm_UP and Rterm_DN can be effectively tuned, thereby increasing signal integrity of the memory system.

Although the invention has been described with reference to the preferred embodiments, the preferred embodiments are for descriptive purposes only. As it will be apparent to one of ordinary skill in the art that modifications of the described embodiments may be made without departing from the spirit and scope of the invention, the scope of the appended claims is not to be interpreted as being restricted to these embodiments.

As described above, in the devices and methods for controlling active termination resistors according to the present invention, the on/off of the termination resistors can be controlled irrespective of an operational mode of a delay locked loop (DLL) or phase locked loop (PLL), thereby minimizing data bubbles.

The devices for controlling active termination resistors according to the present invention advantageously increase a data rate of a memory system having a stub bus configuration. The resistance of each of the termination resistors Rterm_UP and Rterm_DN can be effectively tuned, thereby improving the signal integrity of the memory system.

What is claimed is:

1. A memory circuit, comprising:

a node; and a termination resistor which provides a termination resistance for the memory circuit, comprises a plurality of resistors which are selectively connected between the node and a reference voltage; and a control circuit which receives an externally supplied active termination control signal, to synchronously switch on and off a connection of the node to the reference voltage through the termination resistor according to the active termination control signal in a first mode of operation of the memory circuit, and to asynchronously switch the connection of the node to the reference voltage through the termination resistor according to the active termination control signal in a second mode of operation of the memory circuit.

2. The memory circuit as claimed in claim 1, wherein the connection is switched on and off in synchronization with an external clock signal and in accordance with the active termination control signal in the first mode.

3. The memory circuit as claimed in claim 2, wherein the connection is switched on and off asynchronously with respect to the external clock signal in accordance with the active termination control signal in the second mode.

4. The memory circuit of claim 3, wherein the memory circuit is formed within a semiconductor chip.

5. The memory circuit as claimed in claim 3, wherein the first mode is an active operation mode of the memory circuit.

6. The memory circuit as claimed in claim 5, wherein the second mode is a power down mode of the memory circuit.

7. The memory circuit as claimed in claim 6, further comprising a synchronization circuit for generating an internal clock signal, which is activated in the first mode and deactivated in the second mode.

8. The memory circuit as claimed in claim 7, wherein the synchronization circuit is one of a delay locked loop circuit and a phase locked loop circuit.

9. The memory circuit as claimed in claim 8, wherein the connection of the node to the reference voltage through the termination resistor is off when data is read from the memory circuit.

10. The memory circuit as claimed in claim 9, wherein, in the second mode, the connection of the node to the reference voltage through the termination resistor is switched on after a predetermined length of time after the active termination control signal is received.

11. The memory circuit as claimed in claim 10, the predetermined length of time is does not vary in response to the external clock signal.

12. The memory circuit as claimed in claim 11, further comprising a mode register to store data used in determining the operation mode.

13. A memory comprising:

a node connected to a terminal of the memory; and a termination resistor which provides a termination resistance for the memory circuit selectively connected between the node and a reference voltage; and a control circuit which synchronously switches on and off the selective connection of the termination resistor between the node and the reference voltage according to an externally supplied active termination control signal when the memory circuit is in an active operational mode, and which asynchronously modifies the selective connection of the termination resistor between the node and the reference voltage according to the active termination control signal when the memory circuit is in an asynchronous mode comprising at least one of a standby mode and a power down operational mode.

14. The memory as claimed in claim 13, further comprising a synchronization circuit for generating an internal clock signal, which is activated in the active operational mode and deactivated in the asynchronous mode.

15. The memory as claimed in claim 14, wherein the synchronization circuit is one of a delay locked loop circuit and a phase locked loop circuit.

16. The memory as claimed in claim 15, wherein the selective connection of the termination resistor is disconnected when data is read from the memory circuit.

17. The memory as claimed in claim 16, wherein in the asynchronous mode, the selective connection of the termination resistor is connected after a predetermined length of time after receipt of the active termination control signal.

18. The memory as claimed in claim 17, the predetermined length of time is not proportional to a period of any received external clock signal.

19. The memory as claimed in claim 13, wherein the termination resistor comprises:

a first UP resistor which is selectively connected between the first reference voltage and the node in response to a first control signal; and a second UP resistor which is selectively connected between the first reference voltage and the node in response to a second control signal.

20. The memory as claimed in claim 19, wherein the termination resistor further comprises:

a first DOWN resistor which is selectively connected between the second reference voltage and the node in response to a third control signal; and a second DOWN resistor which is selectively connected between the second reference voltage and the node in response to a fourth control signal.

21. A memory, comprising:

a semiconductor memory chip including a terminal, an input buffer connected to the terminal and a termination circuit connected the terminal, the termination circuit comprising:

a node connected to the terminal of the memory chip; and a termination resistor which provides a termination resistance for the memory chip, comprises a plurality of resistors which are selectively connected between the node and a reference voltage; and a control circuit which receives an externally supplied active termination control signal, to synchronously switch on and off a connection of the node to the reference voltage through the termination resistor according to the active termination control signal in a first mode of operation of the memory chip, and to asynchronously switch the connection of the node to the reference voltage through the termination resistor according to the active termination control signal in a second mode of operation of the memory chip.

22. The memory as claimed in claim 21, wherein the connection is switched on and off in synchronization with an external clock signal and in accordance with the active termination control signal in the first mode.

23. The memory as claimed in claim 22, wherein the connection is switched on and off asynchronously with the external clock signal in accordance with the active termination control signal in the second mode.

24. A method of operating a memory, comprising:

in a first mode of operation of the memory:

receiving an active termination control signal;

in response to the receipt of the active termination control signal, switching on and off a connection of a resistance between a node and a reference voltage in synchronism with an external clock received by the memory, the node being connected to a terminal of the memory; and in a second mode of operation of the memory:

receiving an active termination control signal;

in response to the receipt of the active termination control signal, switching on and off the connection of the resistance between the node and the reference voltage independent of a switching timing of the external clock received by the memory.

25. The method of claim 24, wherein the second mode of operation comprises a power down mode of operating the memory.

26. The method of claim 24, wherein the second mode of operation comprises a standby mode of operating the memory.

27. The method of claim 24, further comprising:

generating an internal clock during the first mode of operation of the memory; and turning off generation of the internal clock during the second mode of operation of the memory.

28. The method of claim 24, wherein in the second mode of operation of memory, the resistance is disconnected from the node after a substantially fixed period of time has past after receipt of the active termination control signal.

29. The method of claim 24, wherein in the first mode of operation of memory, the connection of the resistance is initiated substantially in phase with a clock edge of the external clock.

30. The method of claim 29, wherein in the first mode of operation of memory, the disconnection of the resistance is initiated substantially in phase with the clock edge of the external clock.

31. The method of claim 24, wherein in the second mode of operation of memory, the initiation of the disconnection of the resistance is not correlated to a timing of a clock edge of the external clock.

32. The method of claim 31, wherein in the second mode of operation of memory, the initiation of the connection of the resistance is not correlated to a timing of the clock edge of the external clock.

33. The method of claim 32, wherein in the first mode of operation of the memory, the connection and disconnection of the resistance are initiated substantially in phase with clock edges of the external clock.

34. The method of claim 24, further comprising:

storing data in a mode register of the memory; and operating in the first mode of operation or in the second mode of operation in dependence on the data stored in the mode register.

*35. A memory system comprising:*

*a controller which generates an active termination control signal; and*

*a memory comprising:*

*a node; and*

*a termination resistor which provides a termination resistance for the memory circuit, comprises a plurality of resistors which are selectively connected between the node and a reference voltage; and*

*a control circuit which receives the externally supplied active termination control signal, to synchronously switch on and off a connection of the node to the reference voltage through the termination resistor according to the active termination control signal in a first mode of operation of the memory, and to asynchronously switch the connection of the node to the reference voltage through the termination resistor according to the active termination control signal in a second mode of operation of the memory.*

*36. The memory system as claimed in claim 35, wherein the connection is switched on and off in synchronization with an external clock signal and in accordance with the active termination control signal in the first mode or the connection is switched on and off asynchronously with respect to the external clock signal in accordance with the active termination control signal in the second mode.*

*37. The memory system as claimed in claim 36, wherein the first mode is an active operation mode of the memory system and the second mode is a power down mode of the memory system.*

*38. The memory system as claimed in claim 37, wherein the memory further comprises a synchronization circuit for generating an internal clock signal, which is activated in the first mode and deactivated in the second mode.*

*39. The memory system as claimed in claim 38, wherein the synchronization circuit is one of a delay locked loop circuit and a phase locked loop circuit.*

*40. The memory system as claimed in claim 39, wherein the connection of the node to the reference voltage through the termination resistor is off when data is read from the memory system.*

*41. The memory system as claimed in claim 40, wherein, in the second mode, the connection of the node to the reference voltage through the termination resistor is switched on after a predetermined length of time after the active termination control signal is received.*

*42. The memory system as claimed in claim 41, wherein the predetermined length of time is does not vary in response to the external clock signal.*

*43. The memory system as claimed in claim 42, further comprising a mode register to store data used in determining the operation mode.*

*44. A memory system comprising:*

*a controller which generates an active termination control signal; and*

*a memory comprising:*

*a node connected to a terminal of the memory;*

*a termination resistor which provides a termination resistance for the memory and which is selectively connected between the node and a reference voltage; and*

*a control circuit which synchronously switches on and off the selective connection of the termination resistor between the node and the reference voltage according to the externally supplied active termination control signal when the memory circuit is in an active operational mode, and which asynchronously modifies the selective connection of the termination resistor between the node and the reference voltage according to the active termination control signal when the memory is in an asynchronous mode comprising at least one of a standby mode and a power down operational mode.*

*45. The memory system as claimed in claim 44, wherein the memory further comprises a synchronization circuit for generating an internal clock signal, which is activated in the active operational mode and deactivated in the asynchronous mode.*

*46. The memory system as claimed in claim 45, wherein the synchronization circuit is one of a delay locked loop circuit and a phase locked loop circuit.*

*47. The memory system as claimed in claim 46, wherein the selective connection of the termination resistor is disconnected when data is read from the memory circuit.*

*48. The memory system as claimed in claim 47, wherein in the asynchronous mode, the selective connection of the termination resistor is connected after a predetermined length of time after receipt of the active termination control signal.*

*49. The memory system as claimed in claim 48, the predetermined length of time is not proportional to a period of any received external clock signal.*

*50. The memory system as claimed in claim 44, wherein the termination resistor comprises:*

*a first UP resistor which is selectively connected between the first reference voltage and the node in response to a first control signal; and*

*a second UP resistor which is selectively connected between the first reference voltage and the node in response to a second control signal.*

*51. The memory system as claimed in claim 50, wherein the termination resistor further comprises:*

*a first DOWN resistor which is selectively connected between the second reference voltage and the node in response to a third control signal; and*

*a second DOWN resistor which is selectively connected between the second reference voltage and the node in response to a fourth control signal.*

*52. A memory system, comprising:*

*a controller which generates an active termination control signal;*

*a semiconductor memory chip including a terminal, an input buffer connected to the terminal and a termination circuit connected the terminal, the termination circuit comprising:*

*a node connected to the terminal of the memory chip; and*

*a termination resistor which provides a termination resistance for the memory chip, comprises a plurality of resistors which are selectively connected between the node and a reference voltage; and*

*a control circuit which receives the externally supplied active termination control signal, to synchronously switch on and off a connection of the node to the reference voltage through the termination resistor according to the active termination control signal in a first mode of operation of the memory chip, and to asynchronously switch the connection of the node to the reference voltage through the termination resistor according to the active termination control signal in a second mode of operation of the memory chip.*

*53. The memory system as claimed in claim 52, wherein the connection is switched on and off in synchronization with an external clock signal and in accordance with the active termination control signal in the first mode or the connection is switched on and off asynchronously with the external clock signal in accordance with the active termination control signal in the second mode.*

*54. A method of operating a memory system, comprising:*

*generating an active termination control signal by a controller;*

*in a first mode of operation of the memory:*

*receiving the active termination control signal;*

*in response to the receipt of the active termination control signal, switching on and off a connection of a resistance between a node and a reference voltage in synchronism with an external clock received by the memory, the node being connected to a terminal of the memory; and*

*in a second mode of operation of the memory:*

*receiving the active termination control signal;*

*in response to the receipt of the active termination control signal, switching on and off the connection of the resistance between the node and the reference voltage independent of a switching timing of the external clock received by the memory.*

*55. The method of claim 54, wherein the second mode of operation comprises at least one from among a power down mode of operating the memory and a standby mode of operating the memory.*

*56. The method of claim 54, further comprising:*

*generating an internal clock during the first mode of operation of the memory; and*

*turning off generation of the internal clock during the second mode of operation of the memory.*

*57. The method of claim 54, wherein in the second mode of operation of memory, the resistance is disconnected from the node after a substantially fixed period of time has passed after receipt of the active termination control signal.*

*58. The method of claim 54, wherein in the first mode of operation of memory, the connection of the resistance is initiated substantially in phase with a clock edge of the external clock.*

*59. The method of claim 58, wherein in the first mode of operation of memory, the disconnection of the resistance is initiated substantially in phase with the clock edge of the external clock.*

*60. The method of claim 54, wherein in the second mode of operation of memory, the initiation of the disconnection of the resistance is not correlated to a timing of a clock edge of the external clock.*

*61. The method of claim 60, wherein in the second mode of operation of memory, the initiation of the connection of the resistance is not correlated to a timing of the clock edge of the external clock.*

*62. The method of claim 61 wherein in the first mode of operation of the memory, the connection and disconnection of the resistance are initiated substantially in phase with clock edges of the external clock.*

*63. The method of claim 54, further comprising:*

*storing data in a mode register of the memory; and*

*operating in the first mode of operation or in the second mode of operation in dependence on the data stored in the mode register.*

* * * * *